United States Patent
Liao et al.

(10) Patent No.: US 7,172,978 B2
(45) Date of Patent: Feb. 6, 2007

(54) MEMS DEVICE POLYMER FILM DEPOSITION PROCESS

(75) Inventors: Hang Liao, Corvallis, OR (US); Timothy Mellander, Albany, OR (US); Mike Groh, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 30 days.

(21) Appl. No.: 10/895,477

(22) Filed: Jul. 21, 2004

(65) Prior Publication Data

US 2006/0019420 A1    Jan. 26, 2006

(51) Int. Cl.
*H01L 21/31* (2006.01)
*H01L 21/469* (2006.01)

(52) U.S. Cl. .................. 438/780; 438/782; 438/787
(58) Field of Classification Search .............. 438/759, 438/761, 780, 782, 787, 788, 725, 781
See application file for complete search history.

(56) References Cited

U.S. PATENT DOCUMENTS

| 5,834,864 | A | * | 11/1998 | Hesterman et al. ... 310/40 MM |
| 6,335,224 | B1 | * | 1/2002 | Peterson et al. ............ 438/114 |
| 6,583,524 | B2 | * | 6/2003 | Brandt ........................ 310/12 |
| 6,635,509 | B1 | * | 10/2003 | Ouellet ....................... 438/106 |
| 2004/0265182 | A1 | * | 12/2004 | Chen et al. ................. 422/100 |
| 2005/0078348 | A1 | * | 4/2005 | Lin ............................ 359/291 |
| 2005/0158448 | A1 | * | 7/2005 | McNeish et al. ........... 427/2.1 |
| 2005/0196900 | A1 | * | 9/2005 | Humphrey et al. ........ 438/114 |
| 2005/0280106 | A1 | * | 12/2005 | Kim ........................... 257/414 |

* cited by examiner

*Primary Examiner*—Zandra V. Smith
*Assistant Examiner*—Seth Barnes

(57) ABSTRACT

A method of depositing polymer thin films on a MEMS device having a wafer stack includes depositing one or more protection films on a polymer thin film layer on the wafer stack, fabricating the MEMS device, and removing the one or more protection films.

14 Claims, 4 Drawing Sheets

MEMS DEVICE POLYMER FILM DEPOSITION PROCESS

BACKGROUND

Electronic storage devices ("storage devices") are capable of storing information in electronic form. Storage devices can include a media for storing the information and some type of read and write mechanism for reading information from the media, and writing information to the media, respectively.

One type of storage media is a polymer film. To store information, a storage device may position its write mechanism relative to the location on the media where the information is to be written. The write mechanism then causes the information to be stored, such as, for example, by heating a probe to cause dimples in the polymer film.

One type of storage device is a memory module that includes one or more micro-electro-mechanical systems ("MEMS") devices such as micromovers, that is, movers that use flexures to move a media relative to a plurality of read and write mechanisms to read from or write to the media at designated locations. Typically, the polymer films on which information may be stored are deposited on the MEMS devices after the MEMS devices are formed.

It would desirable to deposit the polymer films before the movers are formed because it is less expensive, and would allow the use of conventional IC process equipment.

SUMMARY

A method of depositing polymer thin films on a MEMS device having a wafer stack is described. The method includes depositing one or more protection films on a polymer thin film layer on the wafer stack, fabricating the MEMS device, and removing the one or more protection films.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

A method of depositing polymer thin films on MEMS devices with moving parts is provided in the present disclosure. The polymer thin films are deposited on wafer stacks prior to forming the movable MEMS parts. The polymer thin films are protected from the MEMS processes by protection films deposited on the polymer thin films before the MEMS processes are performed. In addition, the protection films are removed after performance of the MEMS processes.

Figure 1:
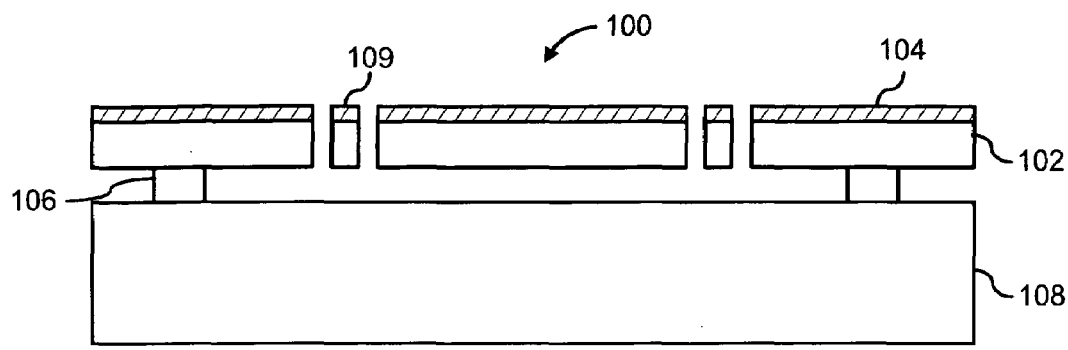
FIG. 1 is a diagram illustrating a mover structure of a memory module according to an embodiment of the invention.

FIG. 1 is a simplified diagram illustrating a portion of a mover structure 100 to be used in a memory module. As shown, the mover structure 100 includes a mover 102. An example of a mover is a micro-mover, such as the micro-movers described in U.S. Pat. No. 5,834,864, Magnetic Micro-mover, and U.S. Pat. No. 6,583,524, Micro-mover with Balanced Dynamics, both of which are incorporated by reference in their entireties. A memory module may contain a plurality of movers 102. Each mover 102 may be connected to a base portion 108 of the memory module, for example, through a bond ring 106. The bond ring 106 holds the mover structure 100 with the control plate 108. The mover structure 100 can move in a x-y plane driven by electrical static or electrical magnetic forces. The spring 109 extends or contracts depending on the movement of the mover structure 100.

Each mover 102 may include a polymer thin film layer 104 on which information may be written to or read from by a read/write mechanism. The polymer thin film layer 104 may include, for instance, polymethylmethacrylate ("PMMA") and the like. The polymer thin film layer 104 may include more than one polymer thin film in a polymer film stack, including, for example, a polymer layer to provide stress relief. The polymer thin film 104 may be deposited on a mover 102, which may be a silicon-based mover device. However, a MEMS device with moving parts generally limits chemical or process conditions that may be used to protect or deposit the polymer thin films 104. In addition, deposition of the polymer thin film 104 after the mover(s) are formed may be difficult since the wafer will include moving parts. For example, moving parts would make conventional integrated circuit process equipment difficult to use and cause poor polymer film uniformity.

The processes performed on the silicon wafer to form the mover(s), such as etch processes, may damage or change the surfaces of the polymer thin film 104 deposited prior to the MEMS processes. To overcome these problems, protection layers may be deposited on the polymer thin film 104 to protect the polymer thin film 104 during the MEMS processes as discussed in greater detail hereinbelow. The protection layers may include a stack of protection layers. For instance, the protection layers may include a first layer (or bottom layer) including a sacrificial polymer to protect the polymer thin film 104 from plasma damage during a dry etch process. The first layer may include, for instance, a polystyrene film and the like. The protection layer may also include a second layer (or top layer) of, for instance, SiO2 and the like, to protect the polymer thin film 104 and the first protection layer during the MEMS processes. The protection layers may also be removed at the end of the MEMS processes without damage to the media film and the MEMS devices with moving parts.

Figure 2A:
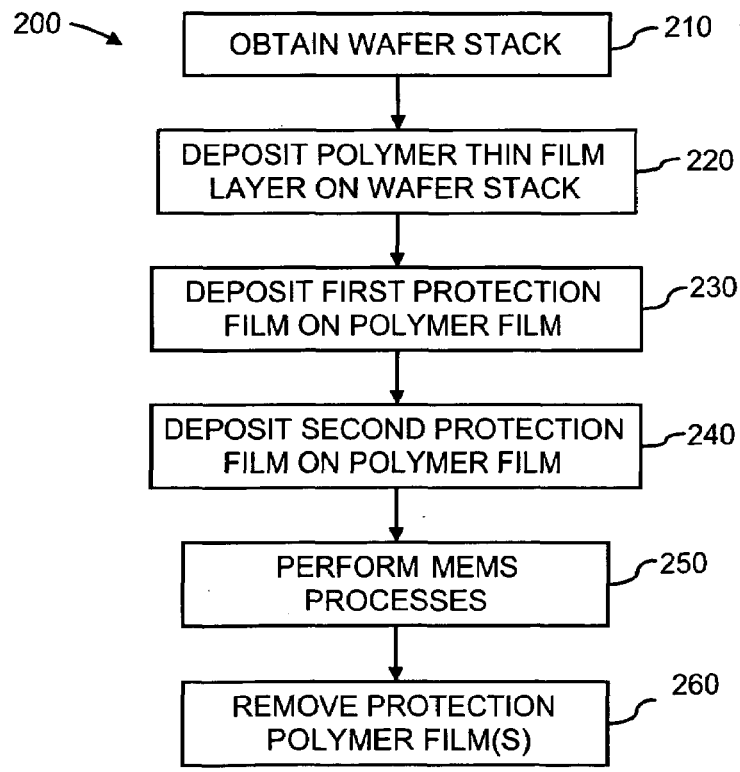
FIG. 2A illustrates a flow diagram of an operational mode for depositing polymer thin films on MEMS devices according to an embodiment of the invention.

FIG. 2A is a flow diagram illustrating an operational mode 200 of a method of protecting a polymer thin film layer during MEMS processes. It is to be understood that the following description of the operational mode 200 is but one manner of a variety of different manners in which a method of protecting a polymer thin film layer during MEMS processes may be practiced. It should also be apparent to those of ordinary skill in the art that the operational mode 200 represents a generalized illustration and that other steps may be added or existing steps may be removed, modified or rearranged without departing from the scope of the invention.

The description of the operational mode 200 is made with reference to FIG. 1 and FIGS. 3A–3F (below), and thus makes reference to the elements cited therein. It should, however, be understood that the operational mode 200 is not limited to the elements set forth in FIGS. 1 and 3A–3F. Instead, it should be understood that the operational mode 200 may be practiced by a polymer thin film protecting process having a different configuration than that set forth in FIGS. 1 and 3A–3F.

Figure 3A:
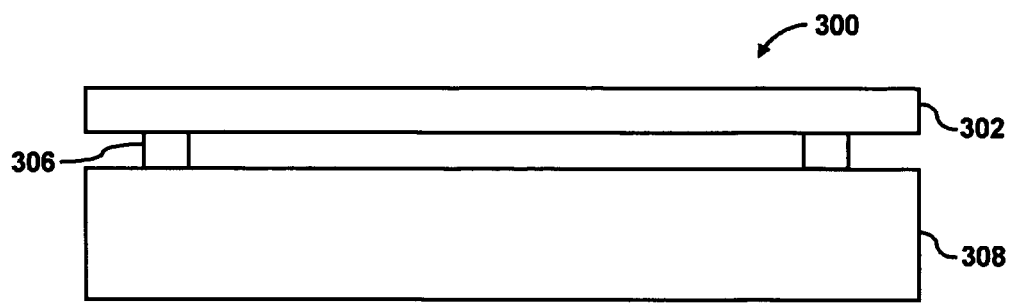
FIGS. 3A–3F illustrate stages of a mover structure during a process for depositing polymer thin films on MEMS devices according to an embodiment of the invention.

The operational mode 200 may be initiated or started as indicated at step 210 by obtaining a wafer stack 300 at step 252. As shown in FIG. 3A, the wafer stack 300 includes a first or top wafer portion 302 connected to a second or base portion 308 of the wafer stack 300 by a bond ring 306. The bond ring may include gold, tin or other materials having relatively high melting temperatures, for instance, in the range of about 200° C. In addition, the wafer stack 300 may comprise any reasonably suitable commercially available wafer stack.

Figure 3B:
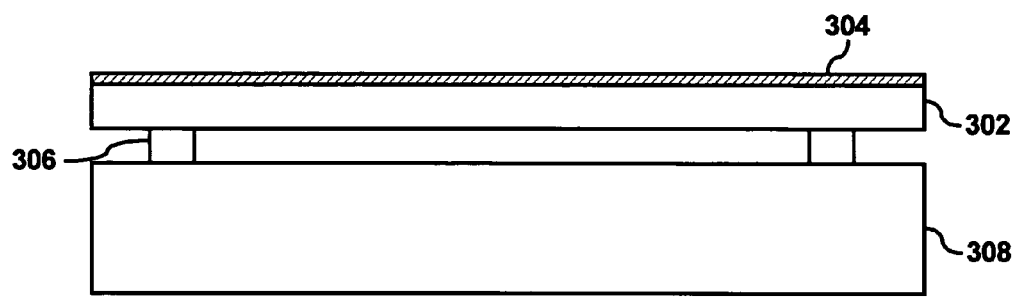

At step 220, the operational mode 200 includes depositing a polymer thin film layer 304 on the first wafer portion 302 as shown in FIG. 3B. The polymer thin film layer 304 may include, for instance, a PMMA thin film and the like. The polymer thin film layer 304 may also include a stress relief polymer, such as, for example, SU-8. SU-8 is a negative, epoxy-type, near-UV photoresist based on EPON SU-8 epoxy resin, such as EPON SU-8 sold by Shell Chemicals of London, U.K., and the materials described in U.S. Pat. No. 4,882,245 to Gelorme et al. The polymer thin film layer 304 can be as thick as 2 mm.

Although a single polymer thin film layer 304 is shown as being deposited onto the first wafer portion 302, a plurality of polymer thin film layers may be deposited onto the first wafer portion 302 without deviating from a scope of the operational mode 200. In addition, one or all of the polymer thin films may be deposited using a spin depositing process.

In one instance, the SU8 may be deposited onto the first wafer portion 302 first to have a thickness of about 70 nm. Then, the PMMA thin film may be deposited onto the SU8 layer to have a thickness of about 50 nm. The thickness of the PMMA film, however, is generally determined by the size of the data bit and the capability of the coating process. Since the MEMS processes have not yet been performed, the first wafer portion 302 and the second wafer portion 308 do not move with respect to each other. Thus, the first wafer portion 302 and the second wafer portion 308 may be spun as one entity during the spin deposit processes for depositing the SU8 and the PMMA thin film.

Figure 3C:
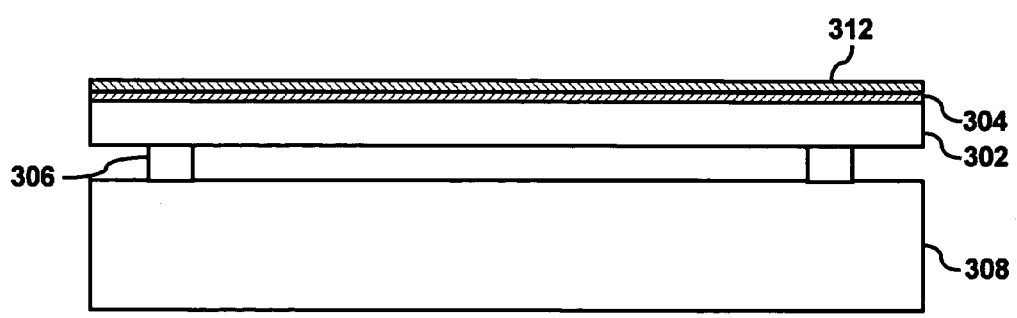

As described with reference to step 230, one or more protection film layers are deposited. FIG. 3C illustrates a first protection film layer 312 deposited on the polymer thin film layer 304. The first protection film layer 312 may include a sacrificial polymer, such as a polystyrene film. The first protection film layer 312 may be spun deposited on the polymer thin film layer 304 to have a thickness of about 60 nm. The first protection film layer 312 should be just thick enough for protection but thin enough to be removed easily using a minimum amount of removal chemical. In addition, the first protection film layer 312 may be spun deposited onto the polymer thin film layer 304 because the first wafer portion 302 and the second wafer portion 308 are attached to each other through the bond ring 306.

Figure 3D:
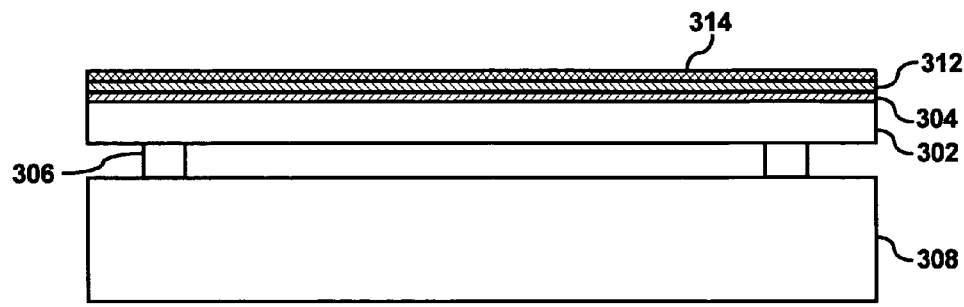

At step 240, a second protection film layer 314 may be deposited on the first protection film layer 312, as illustrated in FIG. 3D. The second protection film layer 314 may include SiO2 to protect the polymer thin film layer 304 during MEMS processes. The SiO2 layer may, for instance, be sputter deposited onto the first protection layer 312 to have a thickness of about 100 nm.

Although not shown in the figures, additional protection film layers may be applied to further protect the polymer thin film layer 304.

Figure 3E:
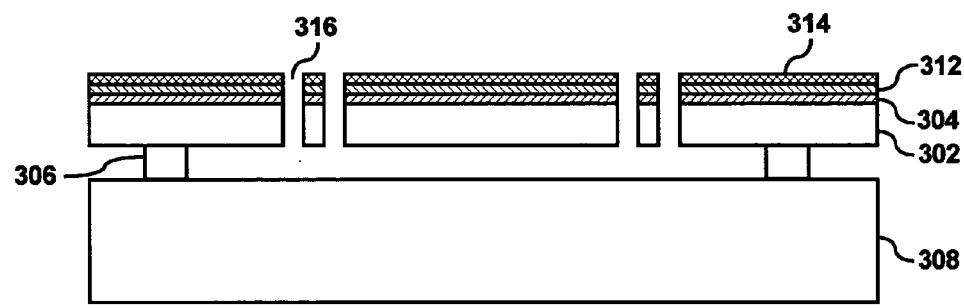

At step 250, MEMS devices are fabricated, for instance, by producing moving parts in the wafer stack 300. As illustrated in FIG. 3E, the top wafer portion 302 is cut to produce openings 316 and thereby enable relative movement between various portions of the top wafer portion 302. The top wafer portion 302 may be cut using a dry etch process, such as plasma etching. The second protection layer 314 generally protects the polymer thin film layer 304 during the plasma etch. The dry etch may be a deep silicon (Si) dry etch. The dry etch etches only the Si, not the SiO2 of the second protection layer 314. The second protection layer 314 may be used to protect the first protection layer 312 and layers underneath the first protection layer 312. The first protection layer 312 may be used to protect polymer thin film layer 304. The first protection layer 312 may be used in combination with the second protection layer 314 because the first protection layer 312 may not be sufficiently strong to survive the first deep Si etch. The first protection layer 312 should be selected not only to protect the polymer thin film layer 304 during the second dry etch to remove the second protection layer 314, but should also be easily removable by a solvent, as described below with respect to step 250.

Figure 3F:
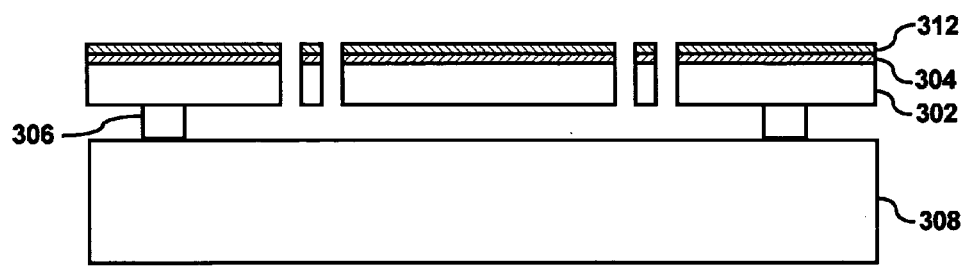

At step 250, when the MEMS processes are completed, the one or more protection films 312, 314 are removed from the wafer stack 300. As illustrated in FIG. 3F, the second protection film 314 is removed first to leave the first protection film 312 over the polymer thin film layer 304. The second protection film 314 may be removed using a dry etch process.

The first protection layer 312 may be removed using a solvent. The solvent may be selected from materials that do not affect the polymer thin film layer 304 or cause problems arising out of adhesion in the moving parts 302. The solvent used to remove the first protection layer 312 is dependent on the material of the first protection layer 312. For example, if polystyrene is used as the first protection layer 312, cyclohexane may be used as the solvent to remove polystyrene. Other solvents that may be used to remove the first protection layer 312, depending on the material of the first protection layer 312, including, for instance, acetone, alcohol, and super critical CO2, and other solvents with low surface tensions, which will not cause adhesion problems in MEMS moving parts. When the first protection layer 312 is removed, the mover structure 100, as shown in FIG. 1 remains.

The operations set forth in the operational mode 200, and described in detail with respect to FIGS. 3A–3F, may be contained as a utility, program, or subprogram, in any desired computer accessible medium. In addition, the operational mode 200 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Examples of computer readable storage devices include conventional computer system RAM, ROM, EPROM, EEPROM, and magnetic or optical disks or tapes. Examples of computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 4:
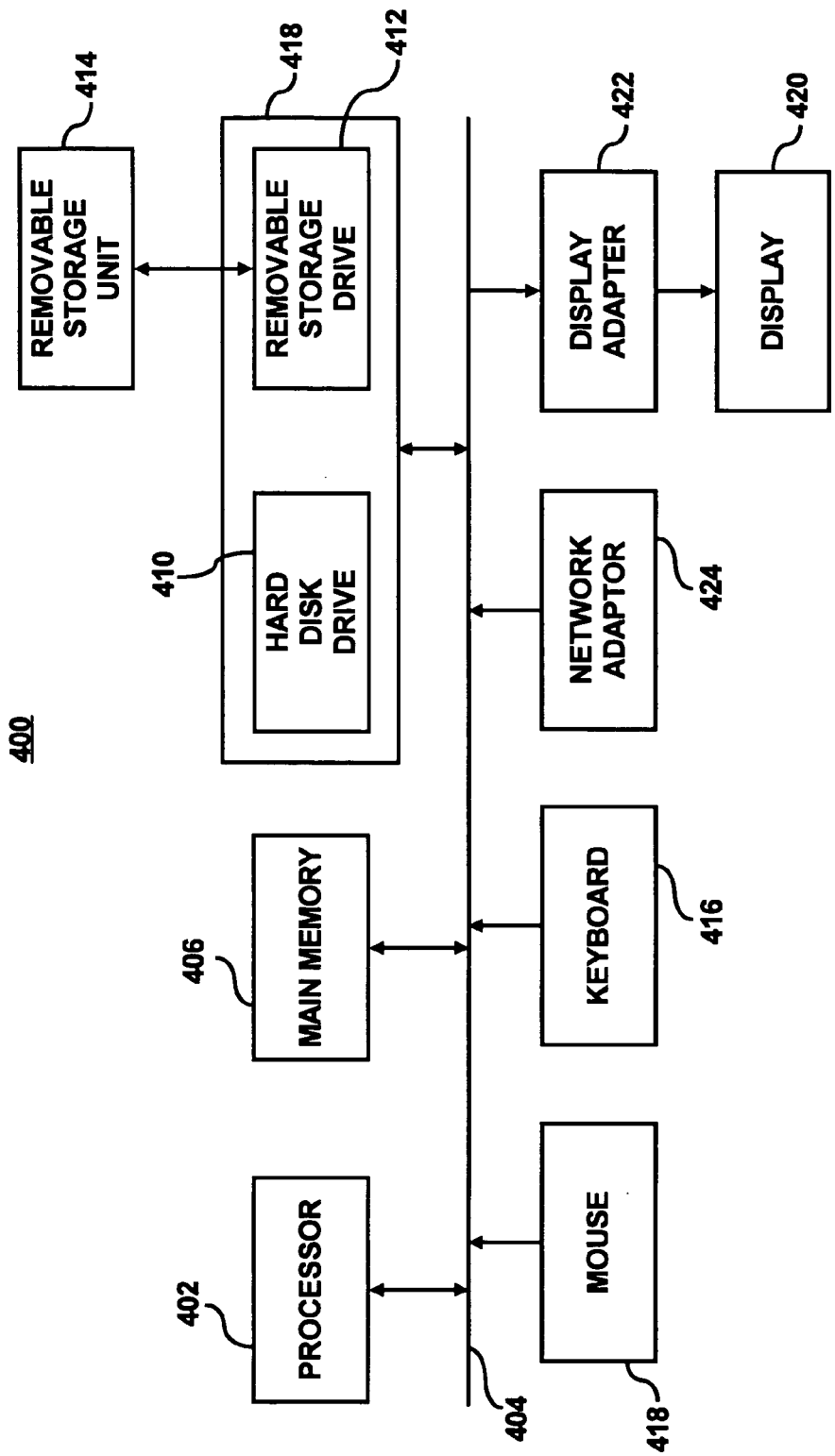
FIG. 4 is a block diagram illustrating a computer system operable to perform the operational mode depicted in FIG. 2A, according to an embodiment of the invention.

FIG. 4 illustrates a computer system 400 operable to control the polymer thin film layer protection process described with respect to the operational mode 200. In this respect, the computer system 400 may be used as a platform for executing one or more of the functions described hereinabove with respect to the various steps outlined in the operational mode 200.

The computer system 400 includes one or more controllers, such as a processor 402. The processor 402 may be used to execute some or all of the steps described in the operational mode 200. Commands and data from the processor 402 are communicated over a communication bus 404. The computer system 400 also includes a main memory 406, such as a random access memory (RAM), where a program code may be executed during runtime, and a secondary memory 408. The secondary memory 408 includes, for example, one or more hard disk drives 410 and/or a removable storage drive 412, representing a floppy diskette drive, a magnetic tape drive, a compact disk drive, etc., where a copy of the program code for the operational mode 200 may be stored.

The removable storage drive 410 reads from and/or writes to a removable storage unit 414 in a well-known manner. User input and output devices may include a keyboard 416, a mouse 418, and a display 420. A display adaptor 422 may interface with the communication bus 404 and the display 420 and may receive display data from the processor 402 and convert the display data into display commands for the display 420. In addition, the processor 402 may communicate over a network, for instance, the Internet, LAN, etc., through a network adaptor 424.

It will be apparent to one of ordinary skill in the art that other known electronic components may be added or substituted in the computer system 400. In addition, the computer system 400 may include a system board or blade used in a rack in a data center, a conventional "white box" server or computing device, etc. Also, one or more of the components in FIG. 4 may be optional (for instance, user input devices, secondary memory, etc.).

By virtue of various characteristics of the disclosed method for MEMS device polymer film deposition process, MEMS devices may be fabricated in manners that overcome some of the disadvantages associated with known MEMS device fabrication techniques. For instance, through use of the disclosed method, standard integrated circuit process equipment may be used to fabricate the MEMS devices and this equipment may be operated at the wafer level. In addition, uniform coatings of polymer thin films may be applied to the MEMS devices and conventional MEMS processes may be performed without substantially damaging the MEMS devices. Moreover, the disclosed method generally enables the above-described operations to be performed on MEMS devices having moving parts.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of depositing polymer thin films on a MEMS device, said MEMS device having a wafer stack, the method comprising:
depositing one or more protection films on a polymer thin film layer deposited onto the wafer stack;
fabricating the MEMS device; and
removing the one or more protection films.

2. The method of claim 1, wherein the step of depositing the one or more protection films comprises depositing two protection films.

3. The method of claim 1, wherein the step of depositing the one or more protection films comprises spin depositing at least one of the one or more protection films.

4. The method of claim 1, wherein the step of depositing the one or more protection films comprises sputter depositing at least one of the one or more protection films.

5. The method of claim 1, wherein the step of depositing the one or more protection films comprises depositing a sacrificial polymer film.

6. The method of claim 5, wherein the step of depositing the sacrificial polymer film comprises depositing a polystyrene film.

7. The method of claim 1, wherein the step of depositing the one or more protection films comprises depositing a SiO2 layer.

8. The method of claim 1, wherein the step of removing the one or more protection turns comprises performing a dry etch to remove at least one of the one or more protection films.

9. The method of claim 8, wherein the step of performing the dry etch comprises performing a plasma etch.

10. The method of claim 1, wherein the step of removing the one or more protection films comprises removing at least one of the one or more protection films using a solvent.

11. The method of claim 10, wherein the step of removing the at least one of the one or more protection films using a solvent comprises removing the at least one of the one or more protection films using cyclohexane.

12. The method of claim 1, further comprising the step of depositing the polymer thin film layer on the wafer stack.

13. The method of claim 12, wherein the step of depositing the polymer thin film layer on the wafer stack comprises spin depositing the polymer thin film layer on the wafer stack.

14. The method of claim 1, wherein the step of fabricating the MEMS device comprises forming at least one movable MEMS part in the wafer stack.

* * * * *

UNITED STATES PATENT AND TRADEMARK OFFICE
CERTIFICATE OF CORRECTION

PATENT NO. : 7,172,978 B2 Page 1 of 1
APPLICATION NO. : 10/895477
DATED : February 6, 2007
INVENTOR(S) : Hang Liao et al.

It is certified that error appears in the above-identified patent and that said Letters Patent is hereby corrected as shown below:

In column 6, line 44, in Claim 8, delete "turns" and insert -- films --, therefor.

Signed and Sealed this

Tenth Day of March, 2009

JOHN DOLL
*Acting Director of the United States Patent and Trademark Office*